United States Patent [19]
Priem et al.

[11] Patent Number: 5,539,430
[45] Date of Patent: Jul. 23, 1996

[54] PIPELINED READ WRITE OPERATIONS IN A HIGH SPEED FRAME BUFFER SYSTEM

[75] Inventors: Curtis Priem, Fremont; Shuen C. Chang, San Jose; Hai D. Ho, Milpitas, all of Calif.

[73] Assignees: Sun Microsystems, Inc., Mountain View; Samsung Semiconductor, Inc., San Jose, both of Calif.

[21] Appl. No.: 145,483

[22] Filed: Oct. 29, 1993

(Under 37 CFR 1.47)

[51] Int. Cl.$^6$ .................................... G09G 1/02
[52] U.S. Cl. .................. 345/185; 345/189; 345/190
[58] Field of Search .................... 345/190, 193, 345/189, 185, 200, 98; 395/166, 164, 165

[56] References Cited

U.S. PATENT DOCUMENTS

| | | | |
|---|---|---|---|
| 4,991,110 | 2/1991 | Hannah | 345/190 |
| 5,017,914 | 5/1991 | Uchida | 345/98 |
| 5,309,173 | 5/1994 | Izzi | 345/190 |
| 5,355,150 | 10/1994 | Murakami | 345/201 |

*Primary Examiner*—Ulysses Weldon
*Assistant Examiner*—Matthew Luu
*Attorney, Agent, or Firm*—Blakely Sokoloff Taylor & Zafman

[57] ABSTRACT

A frame buffer including an array of memory cells for storing data indicating pixels to be displayed on the output display, row addressing decoding apparatus and column address decoding apparatus for selecting memory cells positioned in the array, apparatus for transferring a row address to the row addressing decoding apparatus upon the assertion of a row address strobe signal, apparatus for transferring a column address to the column address decoding apparatus for decoding upon the assertion of a first column address strobe signal, apparatus for latching a column address and any data necessary to complete the access during the first column address strobe signal, apparatus for accessing the particular column the address of which has been latched during the latching of a next subsequent address of a column to be accessed along with any data necessary to complete the next access during the next subsequent column address strobe signal following the first column address strobe signal.

16 Claims, 6 Drawing Sheets

PIPELINED READ WRITE OPERATIONS IN A HIGH SPEED FRAME BUFFER SYSTEM

BACKGROUND OF THE INVENTION

1. Field of the Invention

This invention relates to computer systems and, more particularly, to methods and apparatus for reading and writing to a frame buffer at a high rate of speed.

2. History of the Prior Art

One of the significant problems involved in increasing the ability of desktop computers has been in finding ways to increase the rate at which information is transferred to an output display device. The various forms of data presentation which are presently available require that copious amounts of data be transferred. For example, if a computer output display monitor is operating in a color mode in which 1024×780 pixels are displayed on the screen and the mode is one in which thirty-two bits are used to define each pixel, then a total of over twenty-five millions bits of information must be transferred to the screen with each frame that is displayed. Typically, sixty frames are displayed each second so that over one and one-half billion bits must be transferred each second. This requires a very substantial amount of processing power. In general, the transfer of this data to the display slows the overall operation of the computer.

In order to speed the process of transferring data to the display, various graphics accelerating circuitry has been devised. This circuitry is adapted to relieve the central processor of the computer of the need to accomplish many of the functions necessary to the transfer of data to the display. Essentially, these graphics accelerators take over various operations which the central processor would normally be required to accomplish. For example, block transfers of data from one position on the screen to another require that each line of data on the screen being transferred be read and rewritten to a new line. Storing information within window areas of a display requires that data available for each window portion be clipped to fit within that window portion and not overwrite other portions of the display. Many other functions require the generation of various vectors when an image within a window on the display is cleared or moved. All of these operations require a substantial portion of the time available to a central processing unit. These repetitive sorts of functions may be accomplished by a graphics accelerator and relieve the central processor of the burden. In general, it has been found that if operations which handle a great number of pixels at once are mechanized by a graphics accelerator, then the greatest increase in display speed may be attained. This, of course, speeds the operations involved in the display of graphical material.

A problem which has been discovered by designers of graphics accelerator circuitry is that a great deal of the speed improvement which is accomplished by the graphics accelerator circuitry is negated by the frame buffer circuitry into which the output of the graphics accelerator is loaded for ultimate display on an output display device. Typically, a frame buffer offers a sufficient amount of random access memory to store one frame of data to be displayed. However, transferring the data to and from the frame buffer is very slow because of the manner in which the frame buffers are constructed.

Recently a new frame buffer has been designed which is especially adapted to operate at much higher speeds. Such a frame buffer is described in detail in U.S. patent application Ser. No. 08/145,355 entitled *Frame Buffer System Designed For Windowing Operations*, C. Priem et al, filed on even date herewith. Such a frame buffer provides very fast operations. It is, however, desirable to provide enhancements which accelerate the operation of this improved frame buffer and other frame buffers.

SUMMARY OF THE INVENTION

It is, therefore, an object of the present invention to provide an improved frame buffer capable of more rapidly handling the transfer of data than do prior art frame buffers.

It is another more specific object of the present invention to provide an improved design for a frame buffer to allow accelerated read and write operations on the system data bus.

These and other objects of the present invention are realized in a frame buffer including an array of memory cells for storing data indicating pixels to be displayed on the output display, row addressing decoding apparatus and column address decoding apparatus for selecting memory cells positioned in the array, apparatus for transferring a row address to the row addressing decoding apparatus upon the assertion of a row address strobe signal, apparatus for transferring a column address to the column address decoding apparatus for decoding during the assertion of a first column address strobe signal, apparatus for latching column address and data to be utilized during the access along with any data necessary to complete the access during the first column address strobe signal, apparatus for accessing the particular column the address of which has been latched during the latching of a next subsequent address of a column to be accessed and the data to be utilized to complete the next access during the next subsequent column address strobe signal following the first column address strobe signal.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the apparatus used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION OF THE INVENTION

Figure 1:
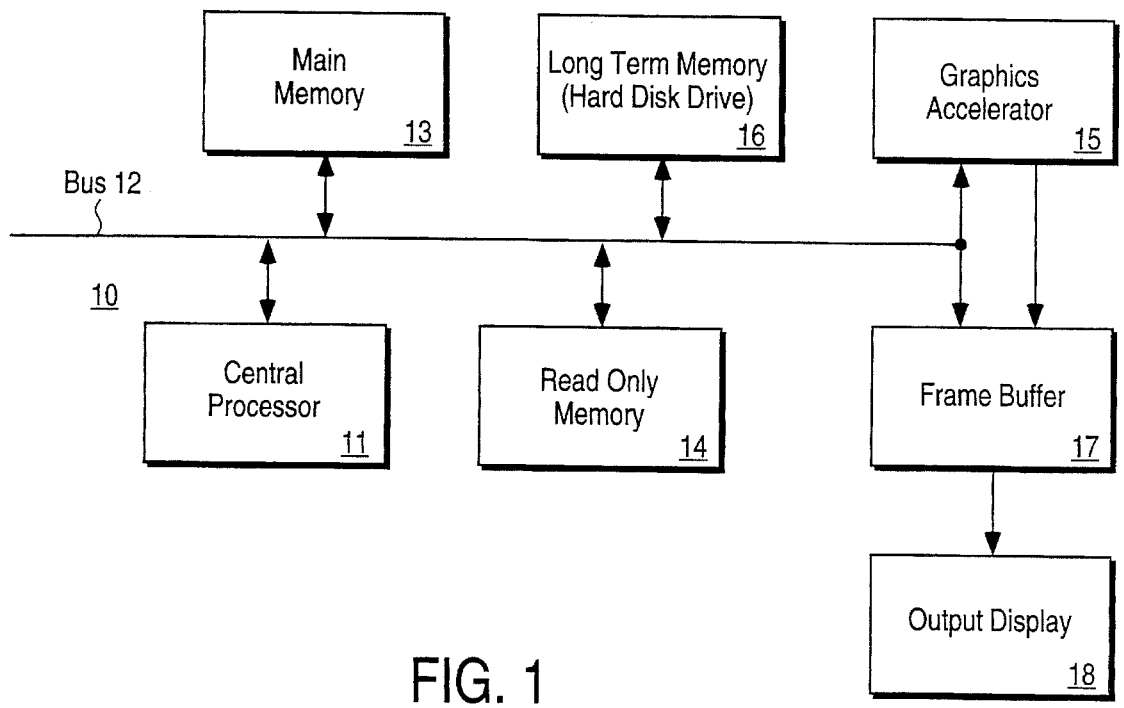
FIG. 1 is a block diagram illustrating a computer system including the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Joined to the bus 12 is main memory 13 which is typically constructed of dynamic random access memory arranged in a manner well known to those skilled in the prior art to store information being used by the central processor during the period in which power is provided to the system 10. Also joined to the bus 12 is read only memory 14 which may include various memory devices (such as electrically programmable read only memory devices (EPROM or similar devices)) well known to those skilled in the art which are adapted to retain a memory condition in the absence of power to the system 10. The read only memory 14 typically stores various basic functions used by the processor 11 such as basic input/output processes and startup processes.

Also connected to the bus 12 are various peripheral components such as long term memory 16. The construction and operation of long term memory 16 (typically electromechanical hard disk drives) are well known to those skilled in the art. Also joined to the bus 12 is circuitry such as a frame buffer 17 to which data may be written that is to be transferred to an output device such as a monitor 18 for display. For the purposes of the present explanation, the frame buffer may be considered to include in addition to the various memory planes necessary to store information, various circuitry well known to those skilled in the art for controlling the scan of information to the output display. FIG. 1 also illustrates a graphics accelerator 15 which may be joined to the bus 12 and is adapted to provide accelerated operation of the frame buffer 17.

Figure 2:
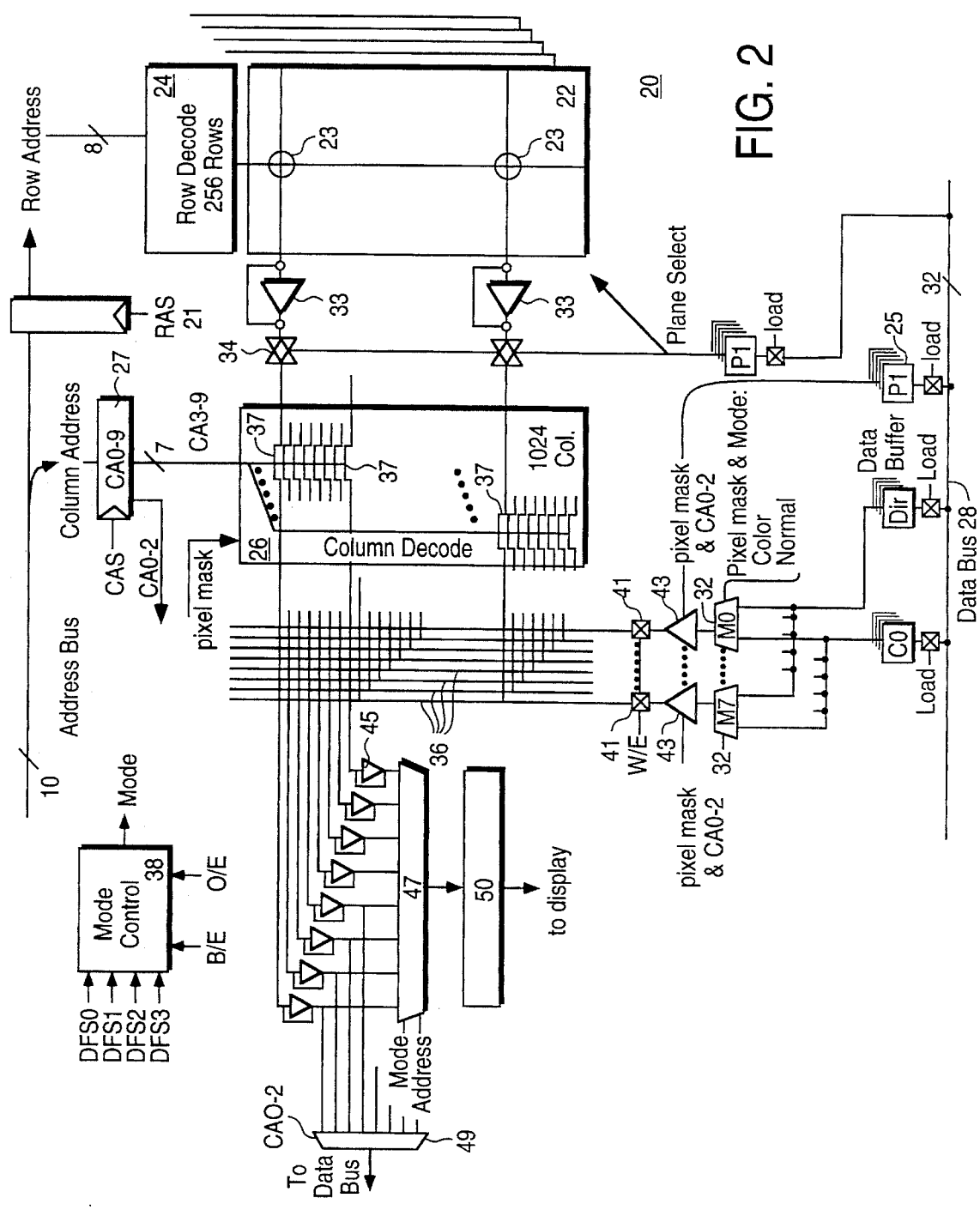
FIG. 2 is a block diagram of a frame buffer designed in accordance the invention of a co-pending patent application.

FIG. 2 illustrates a frame buffer 20 constructed in accordance with the invention described in the above-identified co-pending patent application. Only a sufficient portion of that frame buffer is illustrated to assist in understanding the changes made to and the operation of the present invention. The frame buffer 20 includes a plurality of memory cells 23 such as field effect transistor devices arranged to provide a dynamic random access memory array 22. The arrangement of the memory cells 23 constituting the array 22 is developed in accordance with principals well known to those skilled in the art. It is adapted to provide a sufficient number of addressable memory cells 23 in the array 22 to describe the number of pixels to be presented on an output display device in a particular mode of operation. For example, the array 22 may include a total of thirty-two planes (only the first is illustrated in detail in FIG. 2), each plane including 256 rows, each row including 1024 memory devices. Such an arrangement allows the storage of color data sufficient to display thirty-two bit color in a 512×512 pixel display on a color output display terminal. Although the frame buffer 20 may display both thirty-two bit and sixteen bit color modes as well as other modes well known to those skilled in the art, the frame buffer 20 is particularly adapted for use with pixels displaying color in eight bit color modes.

In addition to the array 22, the frame buffer 20 includes row and column decode circuitry for decoding the addresses furnished by a controller such as a central processor and selecting individual memory cells in each plane of the array 22 to define the various pixels which may be represented on an output display device. The address decoding circuitry includes row decoding circuitry 24 and column decoding circuitry 26 by which individual memory cells 23 representing bits of individual pixels may be selected for reading and writing. Also included as a part of the frame buffer 20 are data conductors 28 which may be connected to a data bus to provide data to be utilized in the array 22. Typically, thirty-two data conductors 28 are provided although this number will vary with the particular computer system.

When data is written to the frame buffer 20 on the conductors 28 of the data bus in the normal mode of operation, each group of thirty-two bits defines one or more color values to be displayed at one or more pixel positions on the output display. Thus, when an output display is displaying data in an eight bit color mode, the thirty-two bits carried by the data conductors 28 in normal write mode may define four pixel positions on the display. On the other hand, when a display is displaying data in a thirty-two bit color mode, the thirty-two bits of information carried by the data conductors 28 define a single pixel position on the display. As may be seen, one of the data conductors 28 of the bus is connected through an input data buffer Din to all of eight multiplexors 32 in each plane of the array. The embodiment illustrated utilizes eight individual multiplexors 32 in each plane of the frame buffer 20 for selecting particular write input data. Each of these multiplexors 32 has its output connected to one of eight tri-state write drivers 43. Each driver 43 furnishes an output signal via a write enable switch such as a transmission gate 41 on a conductor 36 connected to every eighth column of the particular plane of the array. Each of the multiplexors 32 selects the source of the data to be transferred to the array 22 in each plane depending on the mode of operation selected. Thus, in normal mode, the data bit is selected directly from the data conductor 28 for that plane of the array. The bit is transferred from one of the multiplexors 32 by one of the eight write drivers 43 to a particular selected column and written to the memory cell 23 at that column and the selected row. Since a bit may be written in each of thirty-two planes of the array, thirty-two bits may be written from the bus conductors 28 (one to each plane) as one thirty-two bit pixel, as two sixteen bit pixels, or as four eight bit pixels, depending on the color mode in which the system is operating.

As is shown in FIG. 2, a mode control circuit 38 is provided to designate the particular mode of operation in which the frame buffer is to operate. To accomplish mode selection, four control signals DSF0-DSF3 are furnished along with byte enable and output enable signals. The combination of these signals produces the particular output mode control signals in a manner well known to those skilled in the prior art. In the circuit of FIG. 2, the control signals are used along with the byte enable and output enable signals, among other things, to select whether an operation to be accomplished is a read operation or a write operation. They are also used along with the other control signals to determine the data to be written.

For example, the frame buffer 20 may also include at least one color value register C0 utilized to store color values which may be used in color block modes of operation in which a plurality of storage positions may be written simultaneously. Each plane of the array includes a one bit register C0 for storing one bit of a color value. Since each plane includes one bit, the register C0 includes a total of thirty-two bits in the preferred embodiment. Thus an entire eight bit color value may be stored in the register C0 residing on eight planes, an entire sixteen bit color value may be stored in the register C0 residing on sixteen planes, and an entire thirty-two bit color value may be stored in the register C0 of thirty-two planes of the frame buffer 20. With a thirty-two bit color register such as is shown, the color pattern for a particular eight bit color value may be repeated four times in the color register (similarly a sixteen bit color may be repeated twice). The color register C0 may be selectively addressed using a load color register mode so that it may be loaded by data furnished on the conductors 28 of the data bus.

The color register C0 provides color values which the multiplexors 32 may select for writing to the cells of the memory array instead of the data furnished on the conductors 28. The selection by the multiplexors 32 of color values from the register C0 or of pixel data from the conductors 28 depends on the particular mode of operation, a value indicated by control signals including signals DSF0-3 furnished by the central processor or by an associated graphical accelerating device 15 (shown in FIG. 1).

When a color block mode of operation is indicated by the control signals, the data conductors 28, rather than carrying pixel data, carry enabling signals to indicate pixel positions in the array 22 to which the color values held in the register C0 are to be written. These color values are initially loaded from the data conductors 28 of each array plane of the frame buffer 20 in response to a load color register mode control signal.

In the color mode of operation, if a control signal value of one is transferred on a particular data conductor 28, then the value in the color register C0 is written to the storage positions controlled by that conductor 28. The value in the color register C0 is also transferred to all other storage positions by data conductors 28 which transfer a control signal with a one value. On the other hand, no color value is written to the pixel positions controlled by a data conductor 28 on which a zero control value is transferred. Thus, thirty-two different pixel positions may be affected in a single simultaneous transfer; those positions which receive a one value are enabled to receive the value in the color register C0 while those which receive a zero value remain unchanged. The control data appearing on the conductors 28 is sent to a pixel mask register 25. The bits of the pixel mask register 25 are used to control all of the drivers 43 controlling transfer of data to a particular pixel.

In addition to the color value register C0 which provides fast operation, the frame buffer 20 of FIG. 2 includes output circuitry by which pixel data is shifted to an output display device (not shown in the figure). This includes an array of transmission gates 47 which is utilized to shift data from each plane of the array to an output shift register 50. The data in the register 50 is then shifted a bit at a time from each plane to circuitry controlling the display of the pixel data on an output display device.

In a normal mode write operation as practiced in the prior art, a particular address to be accessed is transferred on the address bus to select a particular row and column. The row address is furnished to the row decode circuitry 24 by a row address latch 21 on the failing edge of a row address strobe (RAS) signal. The row address causes power to be furnished to all of the memory cells 23 joined to the particular row of the array in each of the selected planes. This row remains selected during the continued low state of the RAS signal, and the value of each memory cell in the row is sensed by a sense amplifier 33 connected in each column of the array. Once the condition of each cell 23 is sensed, the sense amplifiers 33 are turned on; and each sense amplifier 33 drives the value sensed back to refresh the memory cell 23 in the selected row.

After the refreshing of the memory cells in the row and during the continued low state of the RAS signal, the column address is transferred from a latch 27 on the failing edge of the CAS signal and applied to the appropriate switches 37 of the column decode circuitry 26 to select the columns in each plane to be written. In the embodiment of the frame buffer 20 illustrated, the column address is ten bits. Of these ten bits, the higher valued seven bits CA3-9 of the column address are used to select a group of eight adjacent columns. The normal mode write control signal at each of the multiplexors 32 causes the data furnished on the single conductor 28 associated with that plane to be transferred from the data input buffer Din by each of the eight multiplexors 32. A single one of the write drive amplifiers 43 then transfers the data signal produced by one of the multiplexors 32 to the addressed memory cell 23 in that plane of the array. The lower three bits CA0-2 of the column address from the latch 27 select the particular one of the eight write drive amplifiers 43 which transfers the data bit to a single one of the columns. Since each of the conductors 28 associated with each selected plane of the array 22 carries an individual bit for the memory cell at the selected row and column, the pixel value (or values) will be written to the appropriate column and row position in each plane of the array.

Once a particular row has been selected, if the RAS signal remains in the low condition, a series of different memory cells in different columns in the same row within each plane of the array may be written by furnishing a new column address and new data on the falling edge of each new CAS signal.

Figure 3:
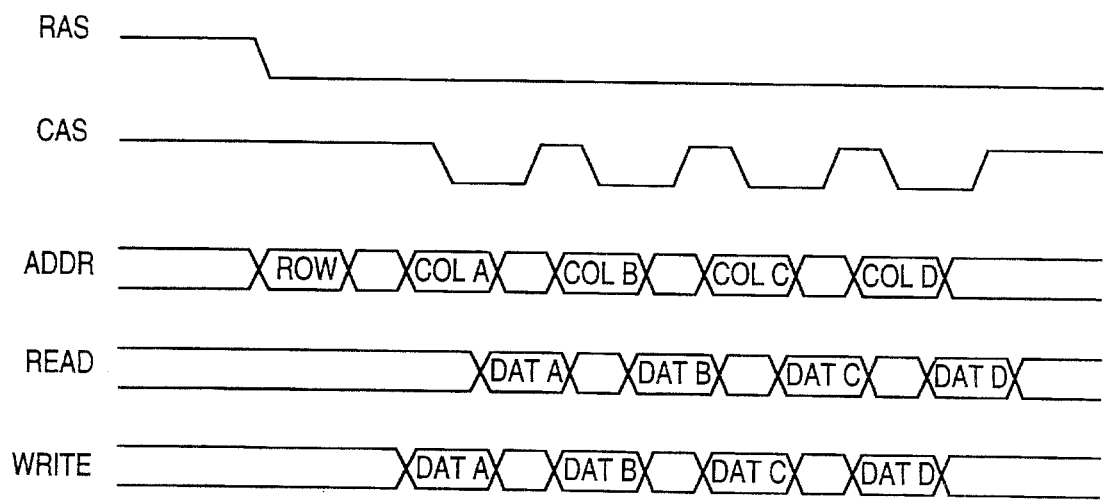
FIG. 3 is a timing diagram illustrating signals used for operating the frame buffer illustrated in FIG. 2.

FIG. 3 is a timing diagram which, among other things, illustrates the operation just described. It will be seen that when the RAS signal is lowered, the row address is furnished to the row decode circuitry 24. The RAS signal remains in the low condition and at the falling edge of each of the CAS signals, an individual column address is applied to the decode circuitry 26 to allow each of the individual memory cell writes to be accomplished. It should be noted that the time required to accomplish each of these individual writes once the first write has occurred is the time necessary to assert and decode the new column address, activate the column select switching, and write the individual memory cell 23. As is shown in FIG. 3, this operation requires a typical time of 40 ns. once the row has been selected and the RAS signal is held low. The total time required to write four pixels in different columns of the same row is thus 240 ns. . . . The reason that the operation requires this amount of time is that a new CAS cycle cannot be asserted until the immediately preceding operation has been entirely completed or control and address signals may interfere with the writing of the data to the preceding memory cells.

In a similar manner, when a particular pixel value is to be read from the array 22 in the normal mode of operation, the row and column addresses are transferred to the decode circuitry 24 and 26. A row address is asserted on the falling edge of the RAS signal, the row address is decoded, and power is furnished to the entire row of memory cells in each selected plane of the array 22. During this initial portion of the RAS signal, the condition of the memory cells 23 in each of the columns is sensed by the sense amplifiers 33, then the amplifiers 33 are energized, and the memory cells of the selected row are refreshed. At the falling edge of a first CAS signal, the higher valued seven bits CA3-9 of the column address are furnished to the decode circuitry 26, and the column address is applied to the appropriate switches 37 of the column decode circuitry 26 to select the eight adjacent columns in each plane which have been addressed and are to be read. The condition of the memory cells 23 in each of these eight columns of each selected plane are sensed and amplified by a second set of output sense amplifiers 45. While this same CAS signal remains asserted in the low state, the output of a particular one of the columns is selected by a multiplexor 49 in each plane. This selection is controlled by the normal mode read signal and the value of the lower three bits CA0-2 of the column address. This causes the condition of a particular memory cell 23 to be transferred to a particular one of the conductors 28 of the data bus associated with that plane of the array 22. Thus, as has been illustrated, the frame buffer 20 carries out the typical normal read and write modes of operation.

As is the case is the write operation, once a particular row has been selected, so long as the row remains selected and the RAS signal remains in the low condition, a series of different memory cells in different columns in the same row within each plane of the array may be selected and read by furnishing additional column addresses on the falling edges of a series of succeeding CAS signals. As is illustrated in FIG. 3, during a read operation the RAS signal is lowered and the row address is furnished to the row decode circuitry 24. The RAS signal remains in the low condition and at the falling edge of the CAS signal, each column address is applied to the decode circuitry 26 to allow each of the individual memory cell reads to be accomplished. It should be noted that the time required to accomplish each of these individual reads once the first read has occurred is the time necessary to assert and decode the new column address, activate the column select switching, read the individual memory cell 23, and activate the appropriate path through the multiplexor 49 to the data bus. As is shown in FIG. 3, this operation also requires a typical 40 ns. once the row has been selected and the RAS signal is held low. The reason that the operation requires this amount of time is that a new CAS cycle cannot be asserted until the immediately preceding operation has been entirely completed or control and address signals may interfere with the reading of the data from the preceding memory cells.

Figure 7:
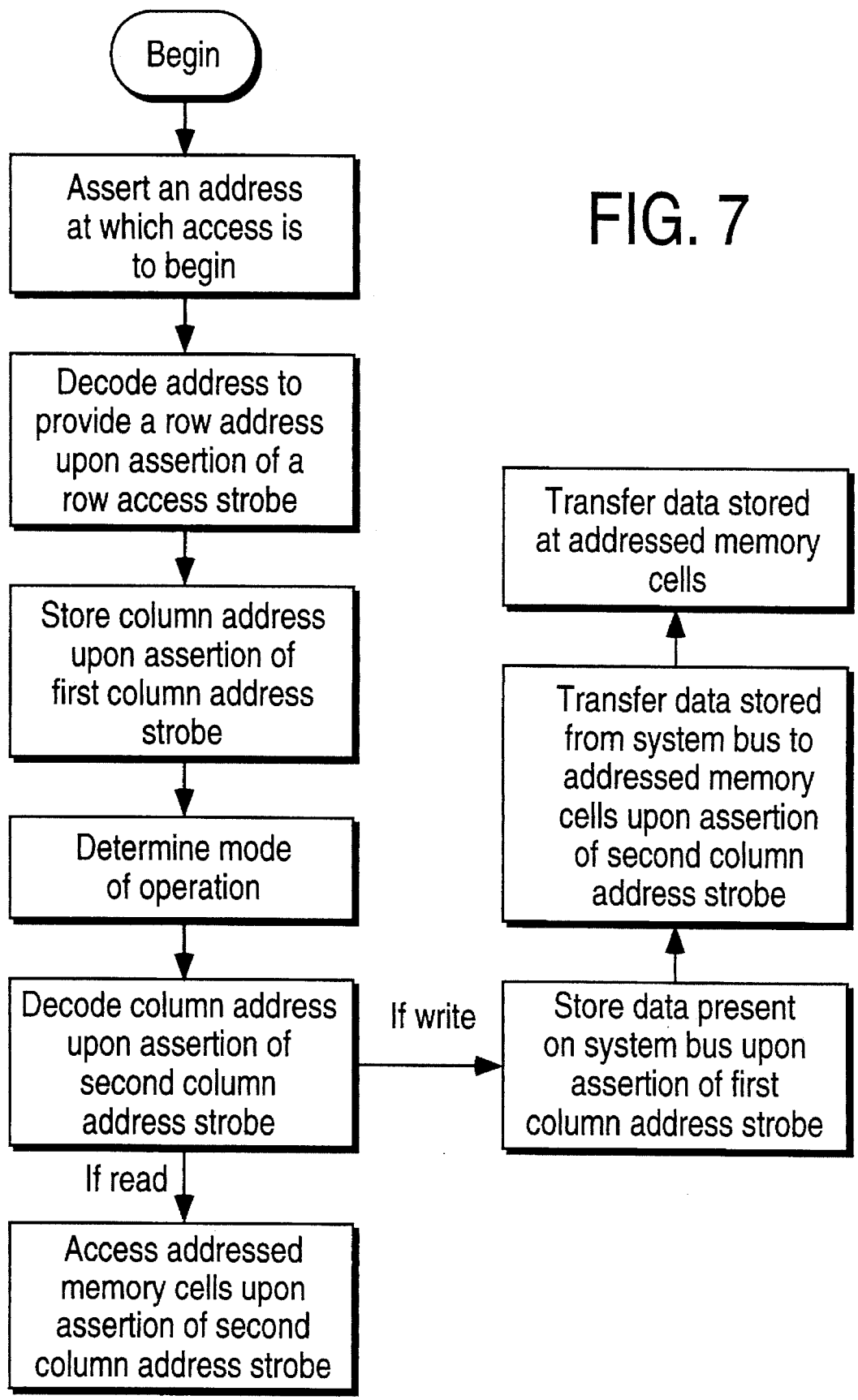
FIG. 7 is a flow chart illustrating a method in accordance with the present invention.

The present invention reduces this time necessary to read or to write to individual memory cells within the same row of a memory array to approximately one-half that required by the prior art. This is accomplished by the addition of the circuitry illustrated in FIG. 4. This circuitry allows the address and the data to be written during a first CAS cycle to be latched by the frame buffer, so that they may be utilized in writing during a second succeeding CAS cycle. The process by which this is accomplished is detailed in the flow chart of FIG. 7 and described in detail herein. Thus, in a first step during a first CAS cycle, the address and data are asserted and latched. Then, in a second step during a second CAS cycle, the data is written to the latched column address of the memory array at the same time that a new address and new data are asserted and latched. In a similar operation, data is read in a two step process in which addresses and data are first latched during a first CAS cycle, then the data is read from the latched addresses on the next operation during a second CAS cycle when the next address from which new data is to be read is asserted. This method of operation reduces the overall time required to accomplish either read or write operations to the same row of a frame buffer to just over half the time required for the same operation when accomplished using the prior art techniques.

Figure 4:
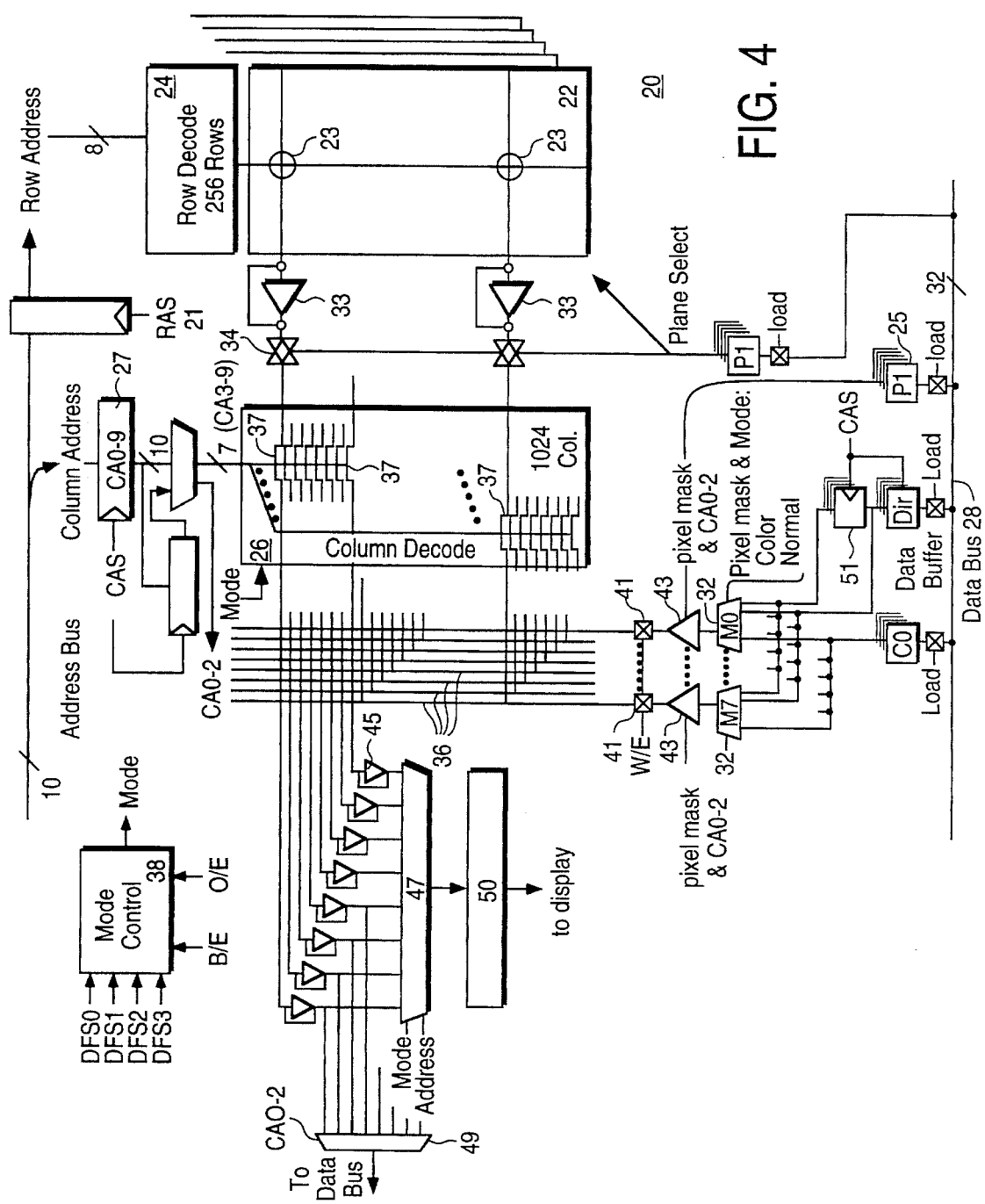
FIG. 4 is a block diagram of a frame buffer designed in accordance with the present invention.

In FIG. 4, the circuit components of the frame buffer 20 are referred by the same numbers as are the components of FIG. 2 where those components remain the same. In addition to those components illustrated in FIG. 2, the circuit of FIG. 4 includes in addition to the Din buffer which receives the data to be written on each of the conductors 28 of the bus, a latch circuit 51. The latch circuit 51 receives the output of the buffer Din at the failing edge of the CAS cycle. The latch provides the latched value as output on the failing edge of the next CAS cycle. The output of the latch 51 is furnished as another input to the multiplexors 32. This allows the multiplexors 32 to select data from the latch 51 after one CAS cycle delay when in the fast pipelined write mode of operation.

Simultaneously, a similar latch 53 receives the column address from the column address buffer 27 on the falling edge of a CAS cycle. Both the value from the buffer 27 and the value stored in the latch 53 are furnished as input to a multiplexor 54 on the falling edge of CAS cycles. The multiplexor 54 selects either the value from the buffer 27 or the value from the latch 53 (which is delayed by one CAS cycle) in response to mode control signals. In the fast pipelined modes, the value is selected from the latch 53 and used as the column address for the data transferred to the array in the write condition and the signals transferred from the array in the read condition.

Figure 5:
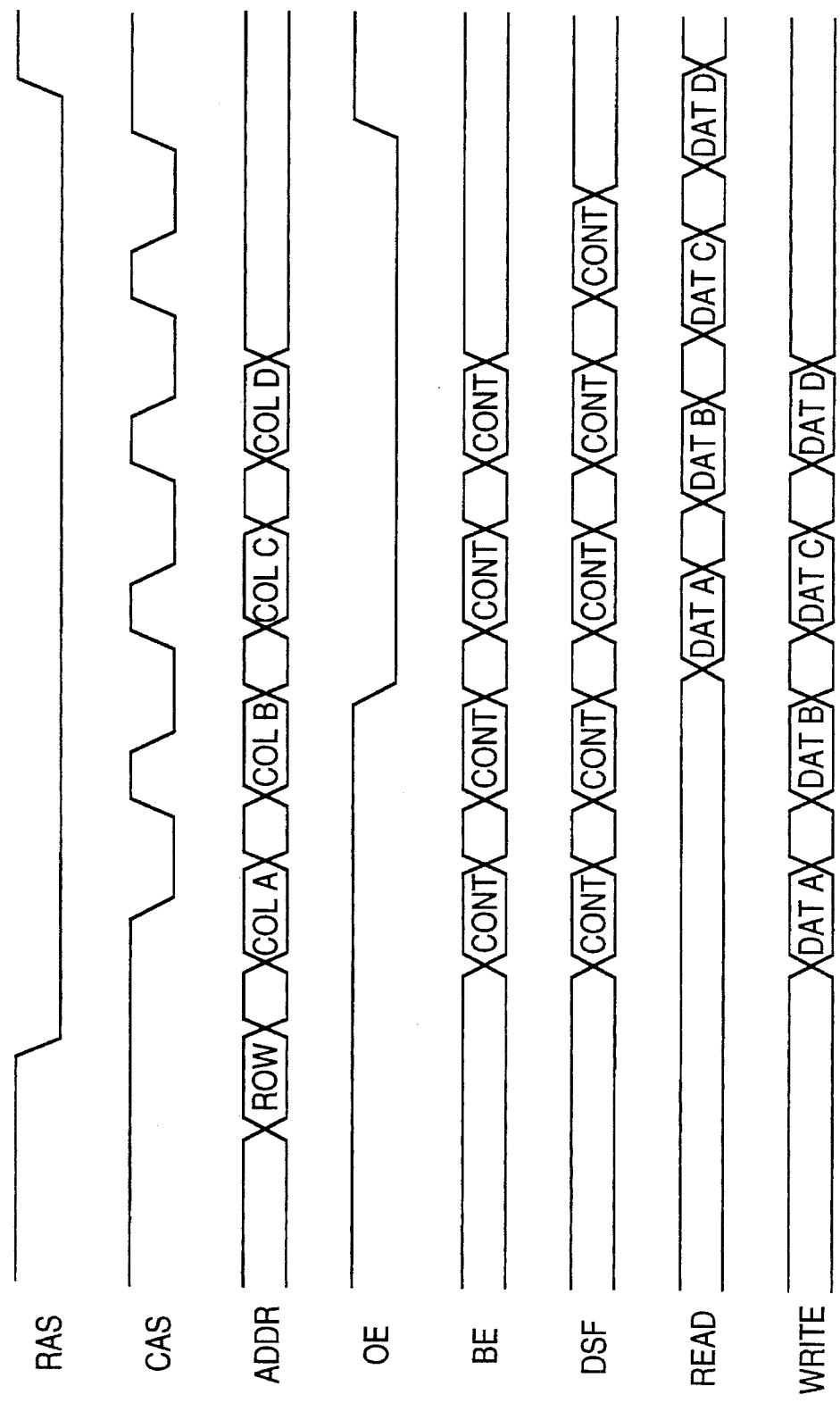
FIG. 5 is a timing diagram illustrating signals used for operating the frame buffer illustrated in FIG. 4.

FIG. 5 illustrates a timing diagram which shows the various signals furnished during the reading of a sequence of four memory addresses at different columns of the same row of a frame buffer designed in accordance with the present invention. The figure also shows the various signals furnished during the writing of a sequence of four memory addresses at different columns of the same row of a frame buffer designed in accordance with the present invention. As may be seen, on the falling edge of the RAS cycle, the row address is asserted. Then, following the appropriate sequence of events to refresh the memory cells of the row selected, the control signals (BE and DSF) indicating the read operation are asserted along with the column address to be read. As is pointed out above, the column address and the data are latched during a first CAS cycle. Then on the next CAS cycle, the memory cell 23 at the column address is read out using the latched data. At the same time, the new column address of the second memory position to be read is asserted along with the control signals (BE and DSF) indicating the read operation. The subsequent cycles proceed in the same manner.

As may be seen, since the individual column addresses used to read and write do not have to be asserted for a period long enough to include all of the steps of the read out of the data from the memory position and onto the bus, the individual CAS cycles may be shortened. Thus, even though an additional trailing CAS cycle is necessary to accomplish the entire sequence of read out operations, each individual GAS cycle is shortened to approximately one-half the length of prior art cycles. Thus, the total time to read out a sequence of four pixels from different columns of the same row is shortened from 240 ns. to 180 ns. Where a longer sequence of pulses are read, a time savings close to one-half is attained.

In a similar manner, in order to write data to the memory cells of the array 22, on the failing edge of the RAS cycle, the row address is asserted. Then, following the appropriate sequence of events to refresh the memory cells of the row selected to be written, the control signals (BE and DSF) which indicate the write operation are asserted along with the column address to be written. Additionally, the data furnished on the data conductors of the bus which is to be written is furnished from the data buffer Din. As is pointed out above, the column address and the data to be written are latched. Then on the next CAS cycle, the memory cell 23 at the latched column address is written with the latched data. At the same time, the new column address of the second memory position to be written is asserted along with the data to be written and the control signals (BE and DSF) indicating the write operation. During this second CAS cycle, the second column address is latched so that it is ready to be used to write during the next CAS cycle. Subsequent write operations occur in the same sequence. Ultimately, it is necessary to complete the last write with an extra CAS cycle.

As may be seen, since the addresses which are to be written do not have to remain asserted over a period to encompass the write of the data to the memory position, the individual CAS cycles may be shortened. Thus, even though an additional CAS cycle is necessary to accomplish the entire sequence of write operations, each individual CAS cycle is shortened to approximately one-half the length of prior art cycles. Thus, the total time to write a sequence of four pixels from different columns of the same row is shortened from 240 ns. to 180 ns. Where a longer sequence of pulses are written, a time savings close to one-half is attained.

Figure 6:
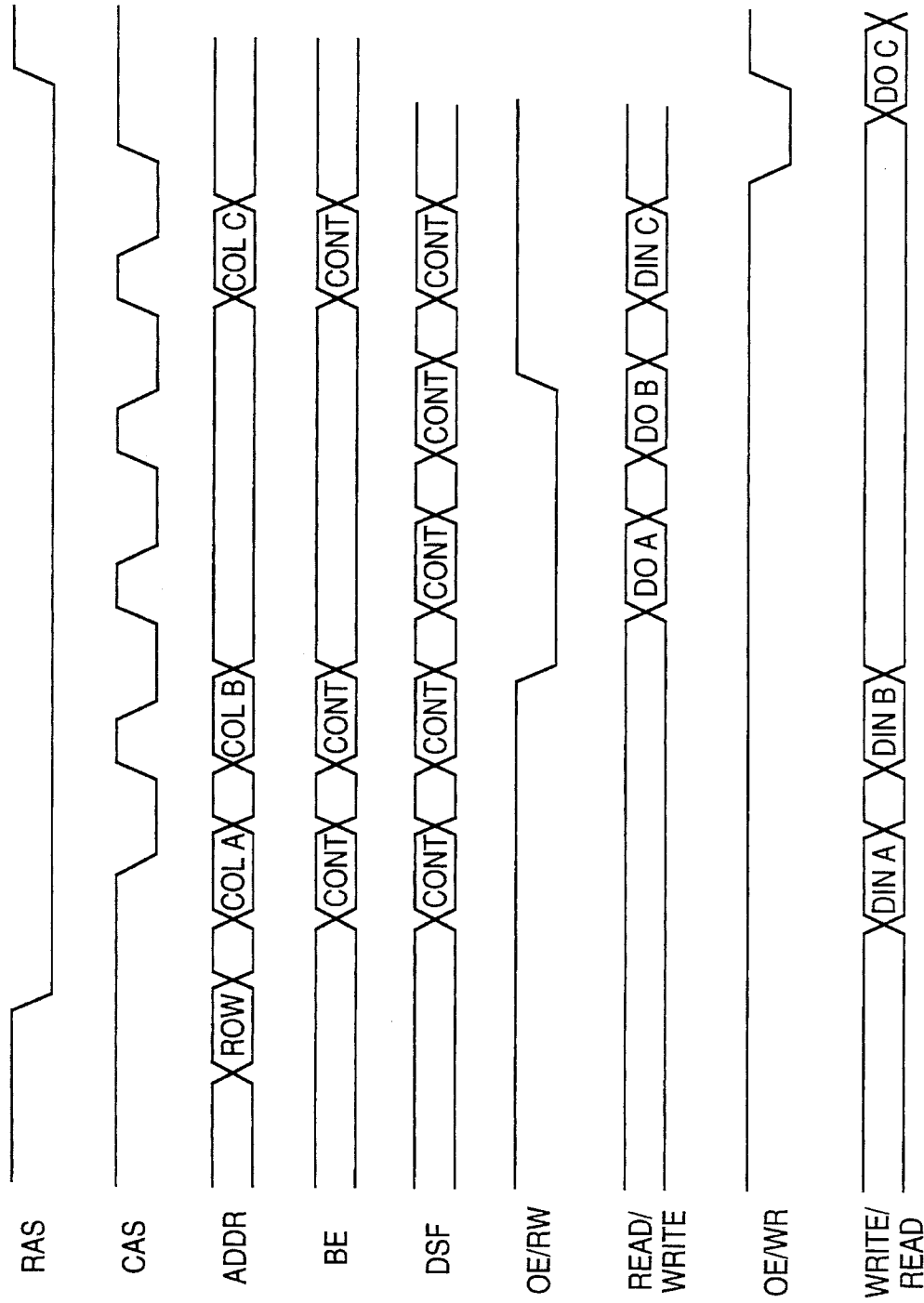
FIG. 6 is a timing diagram illustrating additional signals used for operating the frame buffer illustrated in FIG. 4.

FIG. 6 is a timing diagram which illustrates the operation of the circuitry of the present invention to accomplish read-write operations and write-read operations to memory positions in the same row of a frame buffer array. As may be seen, the operations are almost identical to those for the separate read and write operations. The individual read and write operations are separated, however, by an additional CAS cycle interposed to eliminate interference in the control operations. Again, the time required to accomplish a sequence of operations is considerably less than that required by the prior art. Consequently, the present invention aids greatly in accelerating the operation of frame buffers.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A frame buffer comprising:
   an array of memory cells for storing data indicating pixels to be displayed on the output display,
   row addressing decoding apparatus and column address decoding apparatus for decoding addresses of memory cells positioned in the array,
   a first latching circuit for transferring a row address to the row addressing decoding apparatus upon the assertion of a row address strobe signal,
   a second latching circuit for providing a column address upon the assertion of a first column address strobe signal,
   a third latching circuit for latching a column address from the second latching circuit and providing a column address upon the assertion of a second column address strobe signal,
   a column address control signal circuit coupled to the second and third latching circuits for providing the first column address strobe signal and the second column address strobe signal,
   the column address decoding apparatus including a first multiplexor coupled to the second and third latching circuits, the first multiplexor for receiving the column address from the second latching circuit when the first multiplexor is in a first mode and for receiving the column address from the third latching circuit when the first multiplexor is in a second mode, and
   circuitry for reading from or writing data to the address in the memory array decoded during the second column address strobe signal.

2. A frame buffer as claimed in claim 1 in which the circuitry for reading from or writing data to the address decoded during the second column address strobe signal comprises
   a second mulitplexor for selecting columns of memory cells to be connected to a system bus, and
   circuitry for delaying column addresses transferred for enabling selection by the second multiplexor for one column address strobe cycle.

3. A frame buffer as claimed in claim 1 in which the circuitry for reading from or writing data to the address decoded during the second column address strobe signal comprises:
   a fourth latch circuit for storing input data, and
   circuitry for enabling the latch during the second column address strobe signal to transfer data to a memory cell of the frame buffer.

4. A frame buffer as claimed in claim 1 in which the circuitry for reading from or writing data to the address decoded during the second column address strobe signal comprises:
   a second multiplexor for selecting columns of memory cells to be connected for transferring data to a system bus, the second multiplexor being responsive to a portion of column address signals,
   circuitry for delaying column address signals transferred for enabling selection by the second multiplexor for one column address strobe cycle,
   a fourth latch circuit for storing input data, and
   circuitry for enabling the fourth latch circuit during the second column address strobe signal to transfer data to a memory cell of the frame buffer.

5. A frame buffer comprising:

an array of memory cells for storing data indicating pixels to be displayed on the output display, row addressing decoding means and column address decoding means for decoding addresses of memory cells positioned in the array, a source of a row address control signal, said row address control signal including row address strobe signals, a source of a column address control signal, said column address control signal including column address strobe signals, means for transferring a row address to the row addressing decoding apparatus upon the assertion of a row address strobe signal, first latch means for providing a column address upon the assertion of a first column address strobe signal, the first latch means for receiving and being controlled by the column address control signal, second latch means for providing a column address upon the assertion of a second column address strobe signal, the second latch means for receiving and being controlled by the column address control signal, select means coupled to the first and second latch means for receiving the column address from the first latch means when the select means is in a first mode and for receiving the column address from the second latch means when the select means is in a second mode, and means for transferring data in the array at the address decoded upon the assertion of the second column address strobe signal.

6. A frame buffer as claimed in claim 5 in which the means for storing a column address until a next column address strobe signal is asserted comprises a latching circuit responsive to a column address strobe signal delayed by one column address strobe cycle.

7. A frame buffer as claimed in claim 5 in which the means for transferring data in the array at the address decoded upon the assertion of the second column address strobe signal comprises:

multiplexing means connected to transfer signals read from memory cells of the array, and means for controlling the multiplexing means to select data from memory cells addressed during the column address strobe in which the column address is transferred to the column address decoding means.

8. A frame buffer as claimed in claim 8, in which the means for controlling the multiplexing means to select data from memory cells addressed during the column address strobe in which the column address is transferred to the column address decoding means comprises:

means for transferring a portion of a column address from the means for transferring data in the array at the address decoded during the column address strobe signal in which the column address is transferred to the column address decoding means to control the multiplexing means.

9. A frame buffer as claimed in claim 8 in which the means for transferring data in the array at the address decoded upon the assertion of the second column address strobe signal further comprises:

means for storing data transferred to be written to the array, and means for transferring data stored by the means for storing data to a memory cell during the column address strobe cycle in which the column address is transferred to the column address decoding means.

10. A frame buffer as claimed in claim 5 in which the means for transferring data in the array at the address decoded upon the assertion of the second column address strobe signal comprises:

means for storing data transferred to be written to the array, and means for transferring data stored by the means for storing data to a memory cell during the column address strobe cycle in which the column address is transferred to the column address decoding means.

11. In a frame buffer including an array of memory cells for storing data indicating pixels to be displayed on the output display, row addressing decoding means and column address decoding means for decoding addresses of memory cells positioned in the array, a first and a second latching circuit coupled to a multiplexor and a column address control signal, the column address control signal for providing a first and a second column address strobe signal, the method of transferring data to and from the array comprising the steps of:

asserting a first address in the array at which data is to be transferred, decoding the address to provide a row address upon the assertion of a row address strobe signal, providing a column address to the second latching circuit upon the assertion of the first column address strobe signal, providing a column address to the multiplexor upon the assertion of the second column address strobe signal, selecting the column address from the first latching circuit when the multiplexor is in a first mode, and selecting the column address from the second latching circuit when the multiplexor is in a second mode, and accessing the addressed memory cells of the array upon the assertion of the second column address strobe signal.

12. In a frame buffer, the method claimed in claim 4 further comprising the step of:

transferring data stored at the addressed memory cells of the array to a bus upon the assertion of the second column address strobe signal.

13. In a frame buffer, the method claimed in claim 12 in which the step of transferring data stored at the addressed memory cells of the array to a bus upon the assertion of the second column address strobe signal comprises the steps of:

selecting addressed columns of the array, and transferring data on the addressed columns upon the assertion of the second column address strobe signal.

14. In a frame buffer, the method claimed in claim 11 further comprising the step of:

storing data present on a system bus upon the assertion of the first column address strobe signal, and transferring the data stored from the system bus to the addressed memory cells upon the assertion of the second column address strobe signal.

15. In a frame buffer, the method claimed in claim 11 further comprising the steps of:

storing data present on a system bus upon the assertion of the first column address strobe signal if the access is to write to the memory array, and transferring the data stored from the system bus to the addressed memory cells upon the assertion of the second column address strobe signal if the access is to write to the memory array; and transferring data stored at the addressed memory cells of the array to a bus upon the assertion of the second column addess strobe signal if the access is to read from memory.

16. In a frame buffer, the method claimed in claims 15, in which the step of transferring data stored at the addressed memory cells of the array to a bus upon the assertion of the second column addess strobe signal comprises the steps of:

selecting addressed columns of the array, and transferring data on the addressed columns upon the assertion of the second column addess strobe signal.

* * * * *